United States Patent [19]
Chang

[11] Patent Number: 5,724,001
[45] Date of Patent: Mar. 3, 1998

[54] METHOD AND APPARATUS FOR DEMODULATING A FREQUENCY SHIFT KEYED SIGNAL

[75] Inventor: Chun-Ye Susan Chang, Boca Raton, Fla.

[73] Assignee: Motorola, Inc., Schaumburg, Ill.

[21] Appl. No.: 753,816

[22] Filed: Dec. 2, 1996

[51] Int. Cl.$^6$ .............................. H03D 3/00; H04L 27/14
[52] U.S. Cl. .................. 329/302; 329/303; 375/325; 375/328; 375/335
[58] Field of Search ..................... 329/300, 301, 329/302, 303; 375/324, 325, 328, 334, 335, 336, 337

[56] References Cited

U.S. PATENT DOCUMENTS

| 5,453,715 | 9/1995 | Lee | 375/334 X |
| 5,640,428 | 6/1997 | Abe et al. | 375/334 |

FOREIGN PATENT DOCUMENTS

| 2 057 820 | 4/1981 | United Kingdom . |
| 2 173 364 | 10/1988 | United Kingdom . |

*Primary Examiner*—David Mis
*Attorney, Agent, or Firm*—Eduardo Guntin; John H. Moore

[57] ABSTRACT

A receiver (100) is utilized for demodulating a multi-level frequency shift keyed (FSK) signal. The receiver (100) includes a mixer (102) for mixing the multi-level FSK signal to generate an in-phase signal and a quadrature signal, and a demodulator circuit (110) coupled to the mixer (102). The demodulator circuit (110) is adapted to count a sequence of state transitions of the in-phase signal and the quadrature signal and to determine a frequency deviation of the multi-level FSK signal based on the sequence of state transitions counted.

20 Claims, 7 Drawing Sheets

+ 1600 Hz

− 1600 Hz

+ 4800 Hz

− 4800 Hz 5,724,001

METHOD AND APPARATUS FOR DEMODULATING A FREQUENCY SHIFT KEYED SIGNAL

FIELD OF THE INVENTION

This invention relates in general to the demodulation of FM signals, and particularly, to a method and apparatus for demodulating a frequency shift keyed (FSK) signal.

BACKGROUND OF THE INVENTION

Currently, selective call receivers (SCR's) that receive FSK signals utilize analog demodulation circuits. These circuits employ conventional front-end mixers for mixing a high frequency FSK signal (e.g., 900 MHz) to an intermediate frequency (IF) FSK signal (e.g., 455 KHz). Generally, the IF-FSK signal is demodulated into baseband analog signals by a discriminator circuit (that converts frequency signals to multi-level baseband voltage signals) and a post-detection filter. For a four-level FSK signal, for example, the output of the discriminator is a four level voltage signal, each voltage level representing a symbol (2 bits) of data.

Thereafter, the output of the discriminator is conditioned by a conventional post-detection filter which removes high frequency noise. Finally, the conditioned signal is processed by a conventional symbol detector which converts the four-level signal into digital symbol data (i.e., two data bits of information).

A substantial portion of these circuits is designed with analog circuit techniques. Although these circuits are generally effective in demodulating FSK signals, they characteristically have several undesirable drawbacks. The most significant drawback being that of high energy consumption, which has an adverse effect on the battery life performance of the SCR's. Another significant drawback is the difficulty in manufacturing high quality SCR's that utilize these circuits.

A significant portion of defects in the manufacture of SCR's is found in the analog receivers contained therein. Because of the parametric variances encountered with analog circuit components, an RF tuning step is required for the analog receiver. It is this step where most manufacturing defects are found, and where the manufacturing throughput of SCR's is adversely affected. Yet another difficulty is encountered when analog receiver circuits are integrated into IC's. The disadvantage arises from the need of having to redesign the analog receiver circuit when an IC fabrication process is upgraded to a higher performance fabrication process, e.g., 1 micron to 0.5 micron technology.

In sum, although analog circuits are effective in the design and manufacture of SCR's, their use in SCR's has an adverse effect in manufacturing quality, and is costly when IC fabrication processes are upgraded.

Hence, what is needed is a method and apparatus that overcomes the deficiencies of prior art analog receivers. In particular, a method and apparatus is desired that would provide significant improvements over the energy consumption of prior art analog receivers. Moreover, an apparatus is desired that would be substantially immune to manufacturing defects, and readily portable across different IC fabrication technologies.

DESCRIPTION OF THE PREFERRED EMBODIMENT

Figure 1:
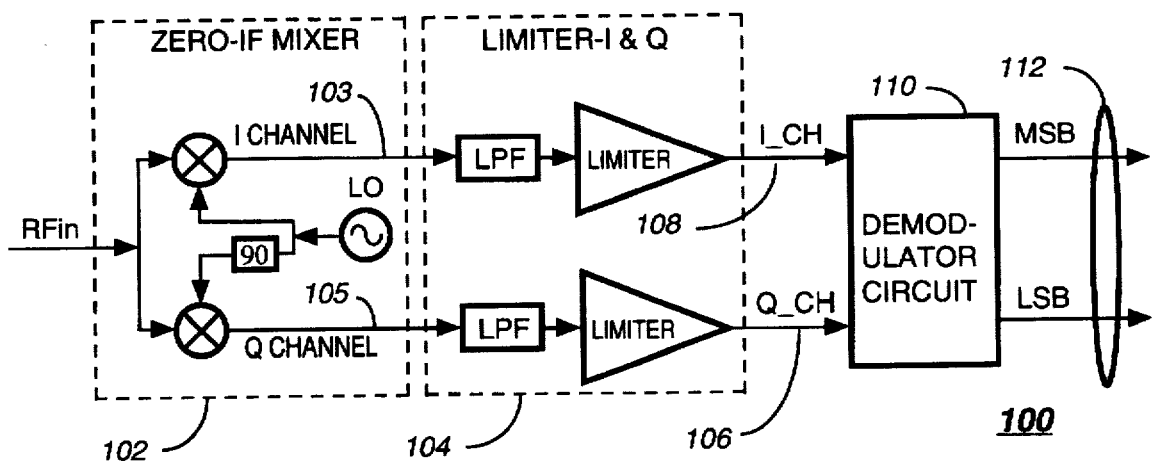
FIG. 1 is an electrical block diagram of a frequency shift keyed (FSK) receiver according to the present invention.
Figure 2:
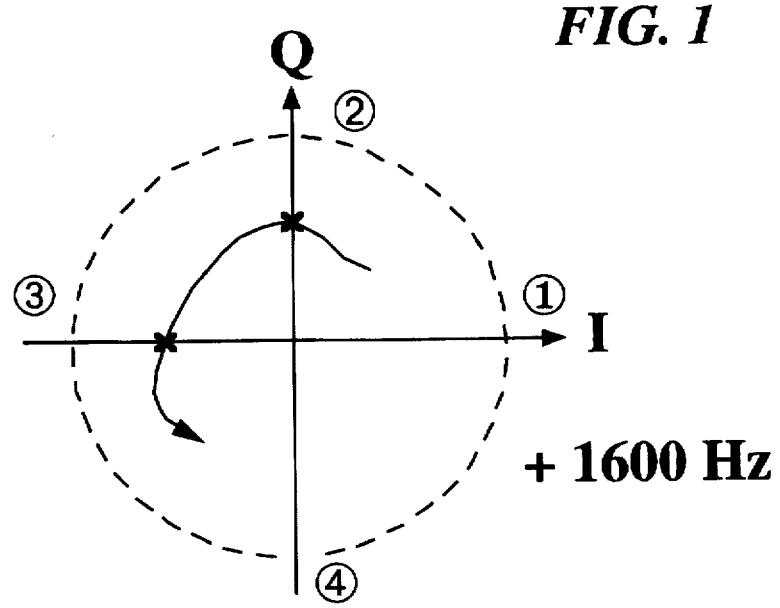
FIGS. 2 through 5 are illustrations of complex domain graphs of unconditioned in-phase and quadrature signals in a noise-free environment for each deviation of a multi-level FSK signal.
Figure 3:
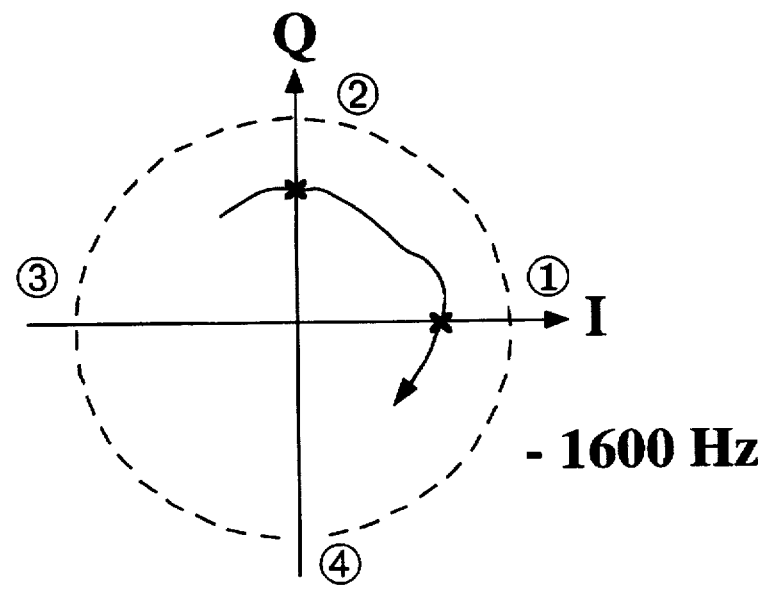
Figure 4:
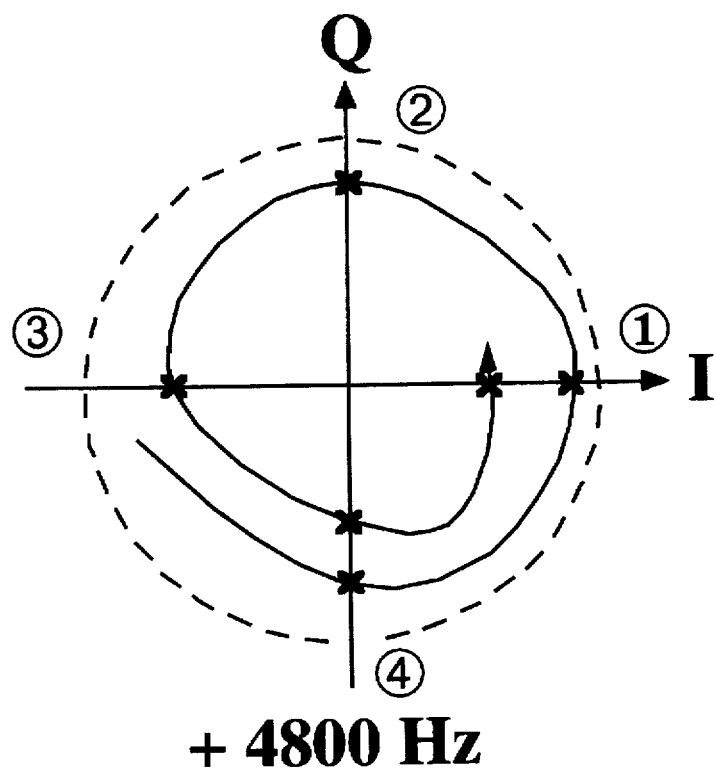
Figure 5:
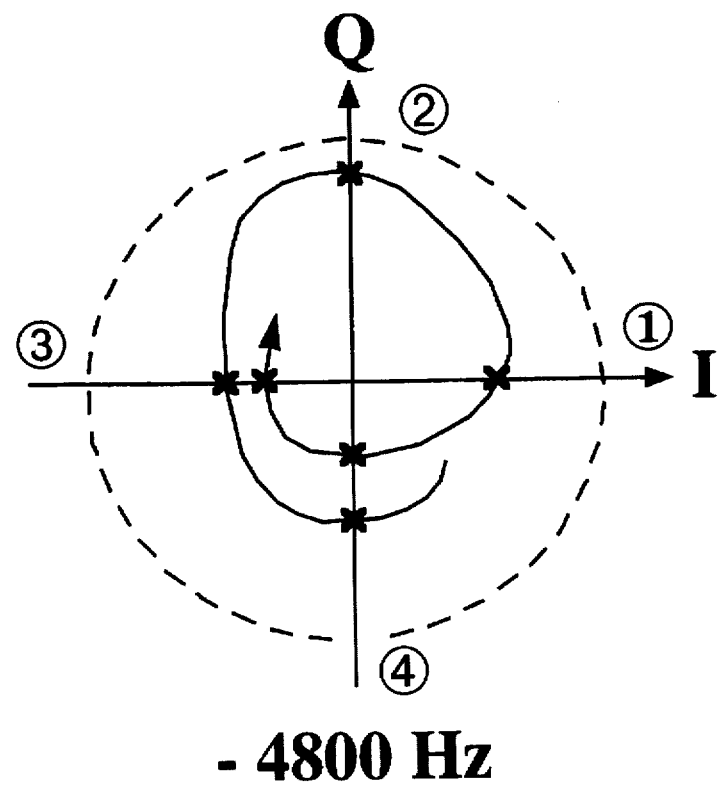

FIG. 1 is an electrical block diagram of a frequency shift keyed (FSK) receiver 100 according to the present invention. The FSK receiver 100 comprises preferably a zero-IF mixer 102, an I-Q (in-phase and quadrature) limiter circuit 104, and a demodulator circuit 110. The zero-IF mixer 102 is a conventional non-coherent mixer comprised of in-phase and quadrature mixers driven from a substantially accurate local oscillator (LO) for generating an in-phase signal, and a quadrature signal, respectively. The zero-IF mixer 102 receives a RF-FSK signal (radio frequency FSK signal shown as RF in FIG. 1) from a conventional high frequency antenna (not shown).

It will be appreciated that, alternative, a conventional front end mixer circuit (well known to those of ordinary skill in the art) can be used along with a conventional quadrature mixer. The front-end mixer is generally used for receiving FSK signals transmitted by a remote transmitter station at high frequencies (e.g., 900 MHz). After a high frequency FSK signal has been mixed by the front-end mixer circuit, an IF-FSK signal results, e.g., 455 KHz. The IF-FSK signal is then mixed down by quadrature mixer to generate an in-phase signal, and a quadrature signal, respectively.

Returning back to the preferred embodiment, once the zero-IF mixer 102 has mixed down the RF-FSK signal to baseband, the unconditioned in-phase and quadrature signals 103, 105 are then processed by the I-Q limiter circuit 104. The conditioning of these signals is performed by two low-pass filters (LPF) and two limiter circuits connected in tandem, respectively. The LPF's remove adjacent channel interference, while the limiters generate a two-level voltage signal representative of conditioned in-phase and quadrature signals (I_CH, and Q_CH) 106, 108, respectively. To do this, the limiter circuit utilizes a one-bit conventional analog-to-digital converter. The two-level voltage output of each limiter circuit is representative of a digital output, i.e., high ("1") and low ("0") digital representations.

The two-level in-phase and quadrature signals are then processed by the demodulator circuit 110 which demodulates these signals into digital symbol data. The demodulator circuit 110 in this example illustrates the demodulation of a four-level FSK signal. For this reason, the output of the demodulator circuit 110 is a two bit output 112. It will be appreciated that, alternatively, the demodulator circuit 110 is designed for demodulating other multi-level FSK signals (e.g., 2-level, 8-level, 16-level, etc.). Hence, the number of levels transmitted with an FSK signal is not critical to the present invention. The discussions that follow for the demodulator circuit 110, however, will be limited to illustrations of demodulating a four-level FSK signal according to the present invention. These discussions should be viewed as being substantially similar to discussions regarding the demodulation of higher or lower levels of FSK signals according to the present invention.

FIGS. 2 through 5 are illustrations of complex domain graphs of the unconditioned in-phase and quadrature signals 103, 105 in a noise-free environment for each deviation, respectively, of a four-level FSK signal. These graphs are presented to illustrate characteristics of the in-phase and quadrature signals that the present invention takes advantage of in demodulating a multi-level FSK signal. The graphs illustrate deviations of ±4800 Hz, and ±1600 Hz from a frequency reference (e.g., 900 MHz carrier). In a complex domain system, the in-phase signal (I) is a real signal, while the quadrature signal (Q) is a complex signal. After plotting the magnitude and phase of these signals in continuous time, the resulting graphs shown in FIGS. 2 through 5 are generated.

Depending on whether the frequency deviation with respect to a carrier signal is positive or negative, the plotted signals have a clockwise or counter-clockwise direction. In particular, for positive deviations the rotation is counter-clockwise, and for negative deviation the rotation is clockwise. This characteristic of the in-phase and quadrature signals is utilized by the demodulator circuit 110 to determine the polarity of the frequency deviation.

Another characteristic of in-phase and quadrature signals when plotted in a complex system, is that depending on the frequency of these signals several rotations may result around the complex domain. Table 1 illustrates an example for a four-level FSK signal transmitted at 3200 symbols per second (or effectively 6400 bits per second).

TABLE 1

| Symbols @ 3200 sym/second | Frequency | No. of Rotations |
| --- | --- | --- |
| 10 | +4800 Hz | counter-clockwise 5–6 |
| 11 | +1600 Hz | counter-clockwise 1–2 |
| 01 | –1600 Hz | clockwise 1–2 |
| 00 | –4800 Hz | clockwise 5–6 |

As Table 1 illustrates, a ±4800 Hz frequency deviation rotates 5 to 6 times in a counter-clockwise/clockwise direction around the complex domain. A ±1600 Hz frequency deviation rotates 1 to 2 times in a counter-clockwise/clockwise direction around the complex domain. This characteristic of the in-phase and quadrature signals is utilized by the demodulator circuit 110 to determine the magnitude of a demodulated frequency deviation. That is, the demodulator circuit 110 counts the number of rotations around the complex domain and compares this information to predetermined ranges to determine the magnitude of the frequency deviation.

With these two pieces of information, i.e., direction of rotation, and number of rotations, a four-level FSK signal the demodulator circuit 110 demodulates frequency deviation into baseband digital data. As noted above, however, the I-Q limiter circuit 104 conditions the in-phase and quadrature signals into digitized two level signals, i.e., "0" or "1." As a result, the continuous curves shown in FIGS. 2–5 cannot be reproduced by the demodulator circuit 110. Instead, a digitized representation of the in-phase and quadrature signals remains. These digitized points of data occur only on the I and Q axis's (shown as "x's" on these figures).

For the present invention, these crossings of the I and Q axis's are defined as states. As the conditioned in-phase and quadrature signals 106, 108 are sampled by the demodulator circuit 110, the demodulator circuit 110 monitors a sequence of states, and a sequence of state transitions. A sequence of states is defined as a sequence of crossings of the I and Q axis's. A sequence of state transitions, on the other hand, is defined as a sequence of transitions between states. Note a transition from one state to the same state is not considered a state transition, and therefore is ignored by the demodulator circuit 110 when counting state transitions. This, as it will be shown, is a useful method for filtering noise.

Figure 6:
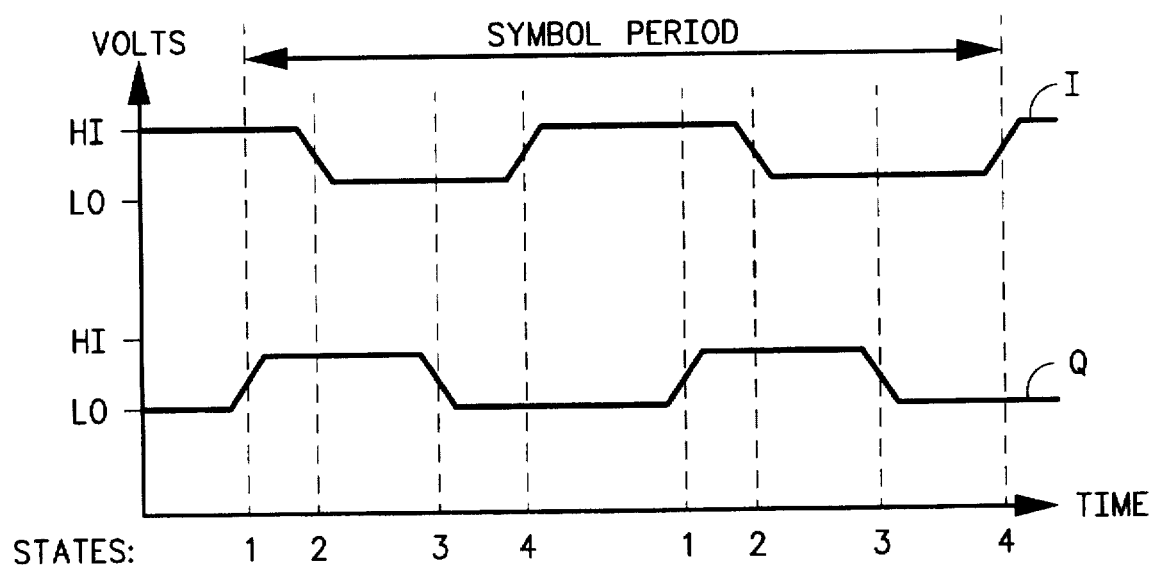
FIG. 6 is an illustration depicting a sequence of state transitions of conditioned in-phase and quadrature signals.

FIG. 6 is an illustration depicting a sequence of state transitions of the conditioned in-phase and quadrature signals 108, 106. Note that the conditioned in-phase and quadrature signals 108, 106 (referred to herein as I-Q signals 108, 106) differ from the unconditioned in-phase and quadrature signals 103, 105 in that the former signals 108, 106 are digitized while the latter signals 103, 105 are not. This results in the square waveforms of FIG. 6 as opposed to sinusoidal waveforms representative of the unconditioned in-phase and quadrature signals 103, 105 (not shown). In determining the present state of the I-Q signals 108, 106, the demodulator circuit 110 monitors each edge transition (rising-edge or falling-edge) of the I-Q signals 108, 106 over a symbol period.

In the example shown in FIG. 6, the first rising-edge of the Q signal occurs while the I signal is high. This represents state I in the complex domain system (i.e., the positive I axis; see FIGS. 2 through 5). The next signal to switch levels is the I signal (falling-edge). During this edge transition the Q signal is HI, thereby representing state 2 (i.e., the positive Q axis). Note the transition from state 1 to state 2 represents one sequence of a state transition. The next signal to switch is the Q signal (falling-edge). During this edge transition the I signal is LO, thereby representing state 3 (i.e., the negative I axis). Finally, the I signal switches from LO to HI. During this edge transition the Q signal is LO, thereby representing state 4 (i.e., the negative Q axis). The four edge transitions that follow represent a repetition of states 1–4 as depicted in FIG. 6.

By tracking the sequence of state transitions, the demodulator circuit 110 determines from the order of the sequence the direction of the I-Q signals 108, 106 around the complex domain (i.e., counter-clockwise or clockwise rotation), and the number of rotations. With this information, the demodulator circuit 110 demodulates the frequency deviation into digitized two-bit data conforming with Table 1.

Figure 7:
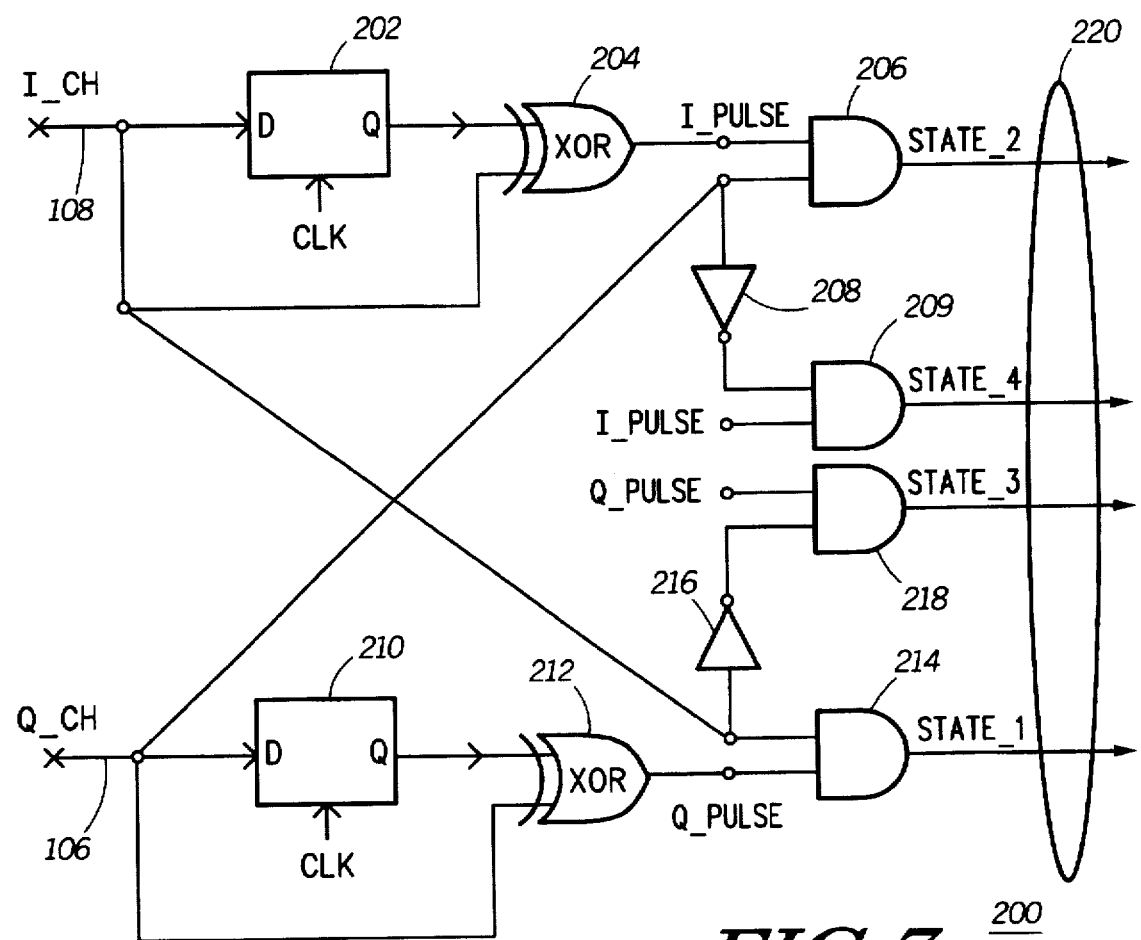
FIG. 7 is an electrical block diagram of a state transition detector according to the present invention.

FIG. 7 is an electrical block diagram of a state transition detector 200 according to the present invention. The state transition detector 200 is an element of circuitry which is part of the demodulator circuit 110 of FIG. 1. The purpose of the state transition detector 200 is to detect transitions between states of the I-Q signals 108, 106.

As shown, the state transition detector 200 comprises two D Flip-Flops 202, 210, two Exclusive OR gates 204, 212, four AND gates 206, 209, 218, 214, and two inverters 208, 216. The state transition detector 200 receives as input the conditioned I-Q signals 108, 106 (also illustrated in FIG. 6). The D Flip-Flops 202, 210, which sample the I-Q signals 108, 106, are clocked by a sampling clock (CLK) that is several times faster than the rate of the I-Q signals 108, 106 (e.g., 76.8 KHz). The combination of the D Flip-Flop 202 and the X'OR 204 serves to detect a transition of the I signal. Similarly, the combination of the D Flip Flop 210 and X'OR 212 serves to detect a transition of the Q signal. When a transition is detected, these circuits generate an I_PULSE and a Q_PULSE, respectively, and the four AND gates 206, 209, 218, 214 in combination with the two inverters 216 serve as state decoders.

For example, assume that the I signal 108 experiences a falling-edge transition, and during that transition the Q signal 106 is high. The falling-edge transition is going to be detected by the combination D Flip-Flop 202, and the X'OR 204, thereby generating a positive pulse, I_PULSE (the pulse duration is approximately one to one half cycles of the sampling clock-CLK). The I_PULSE is then received by both AND gates 206 and 209. AND gate 206 then generates an output representative of state 2 when it detects the I_PULSE and when the Q signal 106 is HI (i.e., the condition for state 2). Similarly, AND gate 209 generates an output representative of state 4 when it detects the I_PULSE and when the Q signal 106 is LO (i.e., the condition for state 4).

The signal generated by AND gate 206 has a duration approximately equal to the duration of I_PULSE. The other state decoders operate in a similar manner as just described. These state outputs (i.e., states 1-4) are applied to a state transition bus 220, which is utilized by an algorithmic state machine (of the demodulator circuit 110) for tracking transitions between states, thereby providing a means for determining the polarity and magnitude of the frequency deviation received. Although this method of demodulation is effective in low-noise environments, further circuitry is necessary in communication systems that encounter Gaussian noise and Rayleigh fading.

Figure 8:
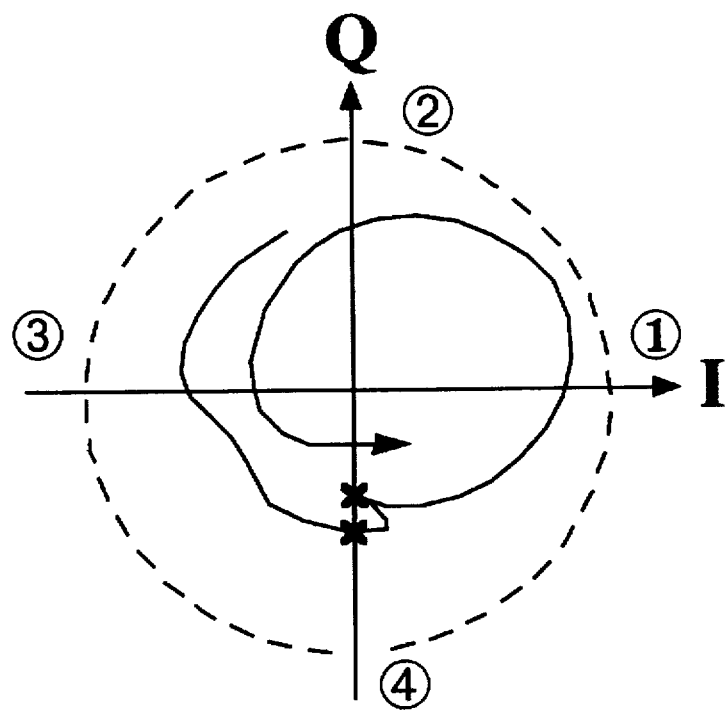
FIGS. 8 and 9 are illustrations of complex domain graphs of the in-phase and quadrature signals in a noisy environment.
Figure 9:
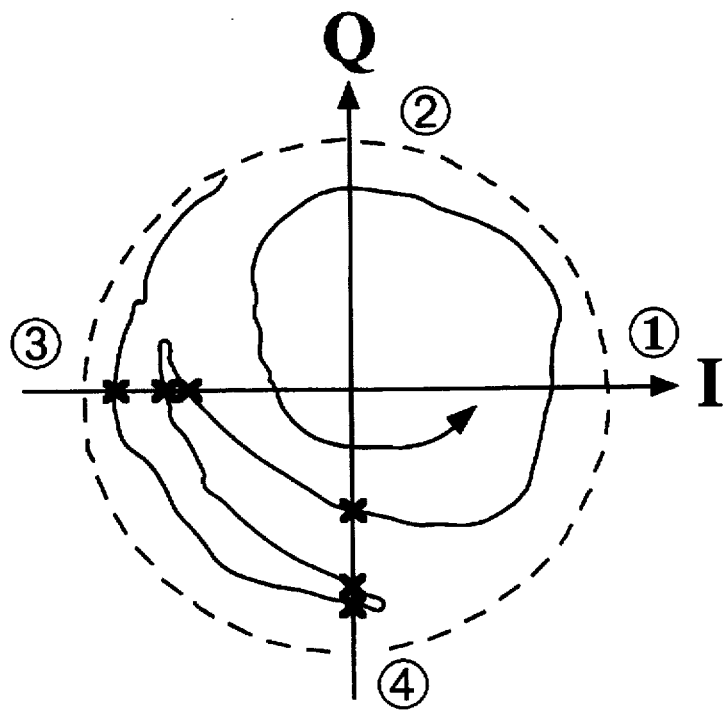

FIGS. 8 and 9 are illustrations of complex domain graphs of the I-Q signals 108, 106 in noisy environments. FIG. 8 illustrates a situation where I-Q signals 108, 106 have embedded noise that results in state 4 transitioning on itself once (the crossings where the noise occurred is noted with "x's"). After the noise has subsided, the rest of the I-Q plot remains normal. This type of noise is typically a short random burst noise. To avoid this type of false state transition, the demodulator circuit 110 utilizes an algorithmic state machine coupled to the state transition bus 220 which ignores state transition pulses of the same state.

The more complex situation arises when the burst error is a lengthy random error as shown in FIG. 9 (again the crossings where the noise occurred is noted with "x's"). In this example, states 3 and 4 have transitioned on themselves, which is ignored by the method just mentioned above. However, the transition from state 4 back to state 3, and then back to state 4 again is not ignored by the same circuit. For this situation, the demodulator circuit 110 utilizes a more sophisticated algorithm.

Figure 10:
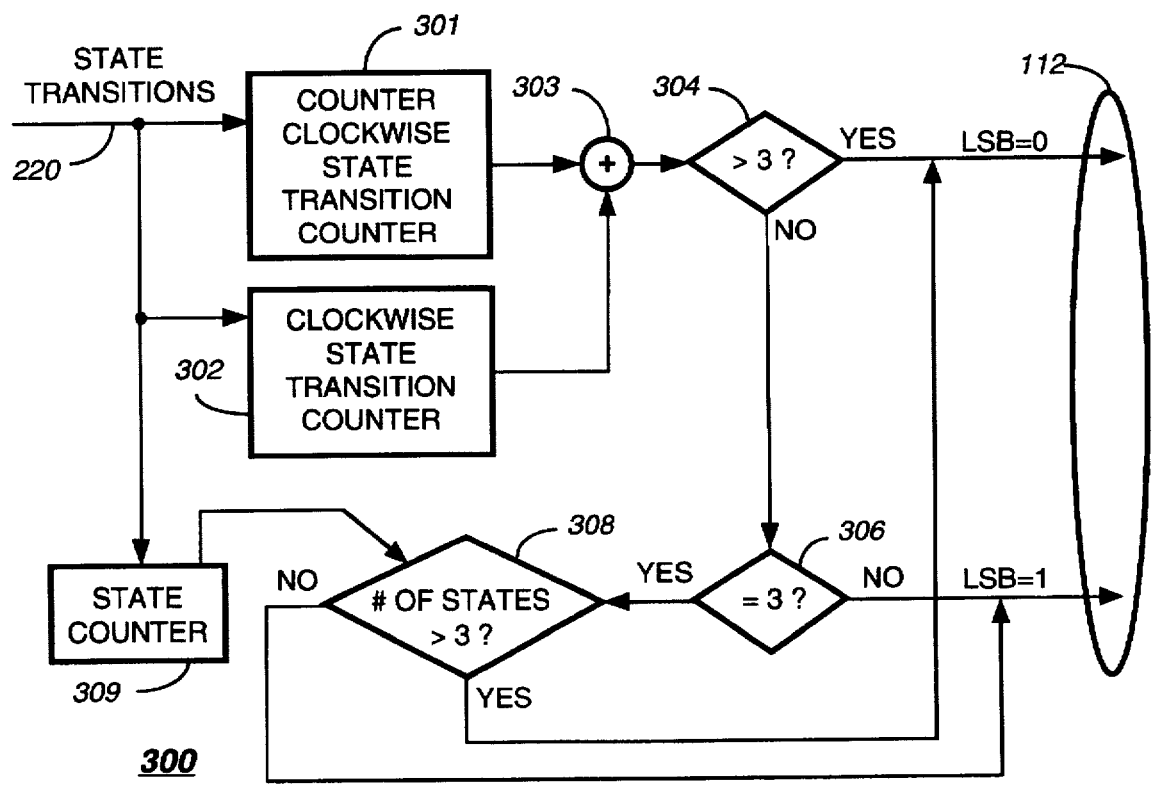
FIG. 10 is an electrical block diagram of a magnitude deviation detector according to the present invention.

FIG. 10 is an electrical block diagram of a magnitude deviation detector 300, which includes an algorithm for resolving the noise problems discussed for FIGS. 8 and 9, according to the present invention. The purpose of the magnitude deviation detector 300 is to determine the magnitude (unit of Hz) of the frequency deviation signal being demodulated. Once it has made this determination, it generates a least significant bit (LSB) equal to a "1" or a "0." Referring back to Table 1, it is worth noting that when the LSB is equal to a "1," this data represents a magnitude of 1600 Hz of the frequency deviation. And when the LSB is equal to "0," the magnitude of the frequency deviation is 4800 Hz.

The magnitude of the frequency deviation as described above, is determined by the number of rotations monitored about the complex I-Q domain, i.e., 5 to 6 rotations for 4800 Hz, and 1 to 2 rotations for 1600 Hz. Hence when 5 to 6 rotations are detected, the magnitude deviation detector 300 generates an LSB equal to "0," and when 1 to 2 rotations are detected the magnitude deviation detector 300 generates an LSB equal to "1." These results generally apply when there is negligible noise in the communication system, i.e., the examples given in FIGS. 2 through 5. However, in a noisy communication environment the number of rotations counted may include both clockwise and counter-clockwise rotations which may in effect generate an intermediate number of rotations between the two expected ranges.

For example, in a noisy environment an intermediate number of rotations, such as 3 rotations, may result. Since 3 rotations is neither in the range of 1 to 2 rotations, or 5 to 6 rotations for 1600 Hz and 4800 Hz deviations, respectively, further decision processing is necessary. The magnitude deviation detector 300, as will be shown shortly, also makes a determination under these conditions.

The magnitude deviation detector 300 comprises a counter-clockwise state transition counter 301, a clockwise state transition counter 302, a state counter 309, a summer 303, and three decision elements 304, 306, 308. The counter-clockwise state transition counter 301, and the clockwise state transition counter 302 are preferably each conventional algorithmic state machines programmed to count upward and downward sequences of states (not including same state transitions), respectively. The upward and downward sequences of states are representative of clockwise and counter-clockwise rotations, respectively, about the I-Q complex domain.

The counter-clockwise state transition counter 301, and the clockwise state transition counter 302 receive as input signals carried by the state transition bus 220. From these signals, the counters 301, 302 determine if the sequence of state pulses is representative of a clockwise rotation or a counter-clockwise rotation about the complex I-Q domain. Note as stated earlier above, transitions between the same state are ignored. To perform this function each counter comprises, for example, a conventional algorithmic state machine to count a sequence of state transitions, ignoring transitions between the same state.

After tracking a number of clockwise and counter-clockwise rotations, the result of each counter is added by the summer 303. The summation result is then processed by the first decision element 304 which determines whether the number of rotations was greater than three. If the number of rotations is greater than three, then the first decision element 304 sets the LSB to "0," representative of the magnitude of the frequency deviation being 4800 Hz. That is, it presumes that the number of rotations counted are near the predetermined range of transitions for a frequency deviation of 4800 Hz (i.e., >3 rotations). If the number of rotations is less than or equal to three rotations, then the second decision element 306 is invoked.

The second decision element 306 looks to whether the number of rotations counted is equal to three. If it is not, i.e., there are less than 3 rotations, the second decision element 306 sets the LSB to "1," representative of the magnitude of the frequency deviation being 1600 Hz. Again, the magnitude deviation detector 300 presumes that the number of rotations counted is near the predetermined range of transitions for a frequency deviation of 1600 Hz (i.e., <3 rotations).

Up to now, the number of rotations is representative of a low noise environment consistent with the example signals shown in FIGS. 2 through 5. If the communication environment was predictably a low noise environment, then no further logic circuits would be necessary, and the magnitude deviation detector 300 would comprise only the circuits discussed up to now. However, in a noisy environment where a lengthy random burst can occur, the potentially illusive situation can result where the number of rotations is three, which is substantially in the middle of the two predetermine ranges of transitions (i.e., >3 and <3 rotations).

When this situation happens, the third decision element 308 is invoked. To make a final determination on the magnitude of the frequency deviation being demodulated, the third decision element 308 utilizes information provided by the state counter 309. The state counter 309 also receives as input the state transition bus 220. However, rather than tracking state transitions only, the state counter counts all states. That is, any sequence of state pulses received from the state transition bus 220 is recorded by the state counter 309. This includes a sequence of state pulses that is representative of a state transition to the same state. The state counter 309 can also be viewed as a counter which tracks the number of crossings in the I-Q complex domain on the I and Q axis's, respectively. While the clockwise and the counter-clockwise state transition counters 301, 302 only records transitions between states that are not repeated.

Referring back to the present situation, when three rotations are detected, the third decision element 308 looks to the sequence of states counted by the state counter 309. If the third decision element 308 detects that the total number of states counted is above three, then the LSB is set to "0," representative of the magnitude of the frequency deviation being 4800 Hz. If the total number of states counted is equal to three, then the LSB is set to "1," representative of the magnitude of the frequency deviation being 1600 Hz.

This algorithm is statistically based. That is, more often than not the proper magnitude will be selected by the magnitude deviation detector 300. Although there may be instances when a magnitude in error is selected, this error may be readily compensated by the data transmitted in the FSK signal utilizing conventional error correction codes.

In summary, when the sequence of state transitions counted is between a first and second predetermined range of transitions, the step of determining the frequency deviation includes assigning a first magnitude of deviation to each frequency deviation demodulated when the sequence of states counted is above a predetermined threshold, and a second magnitude of deviation to each frequency deviation when the sequence of states counted is below the predetermined threshold. In this example, the first and second predetermined ranges were <3 transitions, and >3 transitions, respectively, and the predetermined threshold is 3. These two predetermined ranges pertain to the example of demodulating a four-level FSK signal. It will be appreciated that, alternatively, when demodulating higher or lower multi-level FSK signals (e.g., 2-level, 8-level, 16-level, etc.), the predetermined ranges for adjacent frequency deviations can be different, depending on, for example, the channel bandwidth assigned to a communication system.

Figure 11:
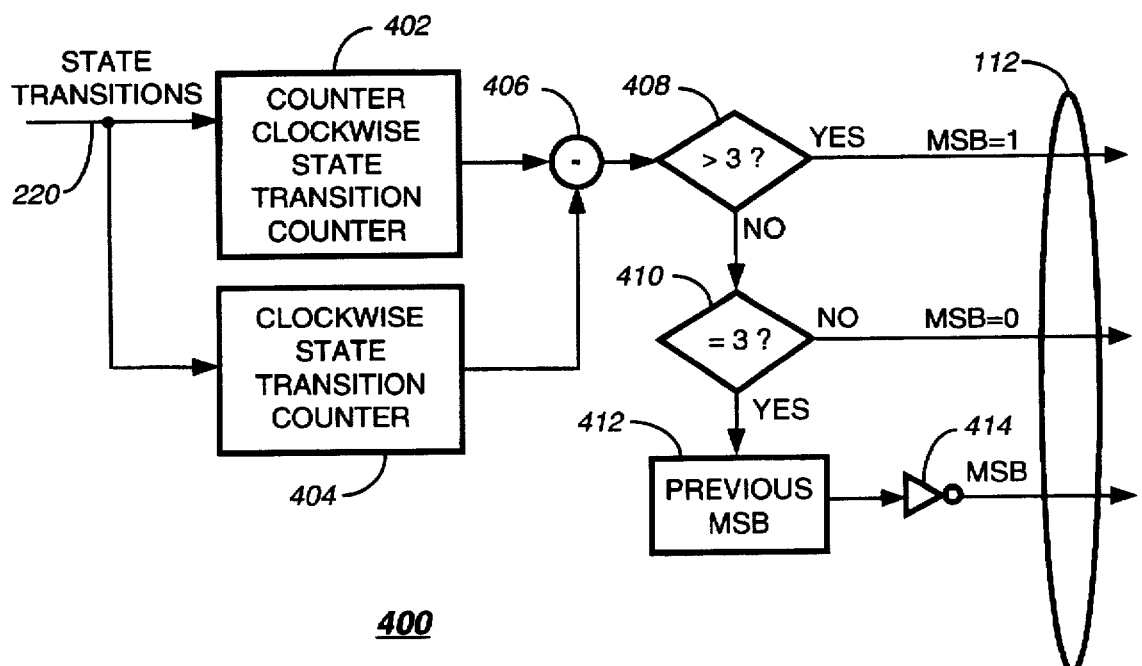
FIG. 11 is an electrical block diagram of a polarity detector according to the present invention.

FIG. 11 is an electrical block diagram of a polarity detector 400 according to the present invention. The polarity detector 400 is yet another circuit element of the demodulator circuit 110 of FIG. 1. Its purpose is to determine the polarity of the frequency deviation being demodulated. Referring back to Table 1, when the MSB is equal to a "1," this data is representative of positive frequency deviations, i.e., +1600 Hz, or +4800 Hz. When the MSB is equal to "0," the polarity of the frequency deviation is −1600 Hz, or −4800 Hz.

To make this determination, the polarity detector 400 utilizes a counter-clockwise state transition counter 402, and a clockwise state transition counter 404. These counters are functionally the same as the state transition counters noted in FIG. 10. In fact, it is preferable that these counters be utilized for the polarity detector 400. However, for the purpose of illustration, these counters have been duplicated in this example. The polarity detector 400 further includes a subtractor 406, two decision elements 408, 410, a memory element 412, and an inverter 414.

During operation, the subtractor 406 subtracts the output of each counter 402, 404 and applies the result to the first decision element 408. If the result is greater than zero rotations, i.e., a counter-clockwise rotation about the I-Q complex domain, then the first decision element 408 sets the MSB to "1," representative of a positive frequency deviation. If the difference generated by the subtractor 406 is equal to or less than zero, then the second decision element 410 is invoked. If the second decision element 410 detects less than zero rotations, i.e., clockwise rotations, then the MSB is set to "0," representative of a negative frequency deviation. However, if the number of rotations is equal in each direction, i.e., a subtraction result of zero, then the MSB is set to an opposite polarity of a previously determined frequency deviation. This is accomplished by storing the polarity of a previously demodulated frequency deviation in the memory element 412 and inverting it with the inverter 414 to generate a new MSB.

The rationale for assigning a polarity to the MSB that is the opposite polarity of a previously demodulated frequency deviation is that two unlike frequency deviations demodulated in sequence with each other may have some overlap between them, thereby causing the counters 402, 404 to detect two sequences, each sequence having a substantially equal number of state transitions going in opposite directions. That is, there may be a residue signal from the previously demodulated frequency deviation that overlaps into the demodulation of the present frequency deviation, thereby causing the polarity detector 400 to detect opposing sequences. When this happens, the polarity detector 400 presumes that a transition between frequency deviations is occurring, e.g., +1600 Hz, to a new frequency deviation, e.g., −1600 Hz.

Thus, once the magnitude deviation detector 300, and the polarity detector 400 have determined the LSB and the MSB, respectively, the frequency deviation has been demodulated to baseband digital data. The digital data included in the MSB and the LSB is representative of a symbol of data.

Figure 12:
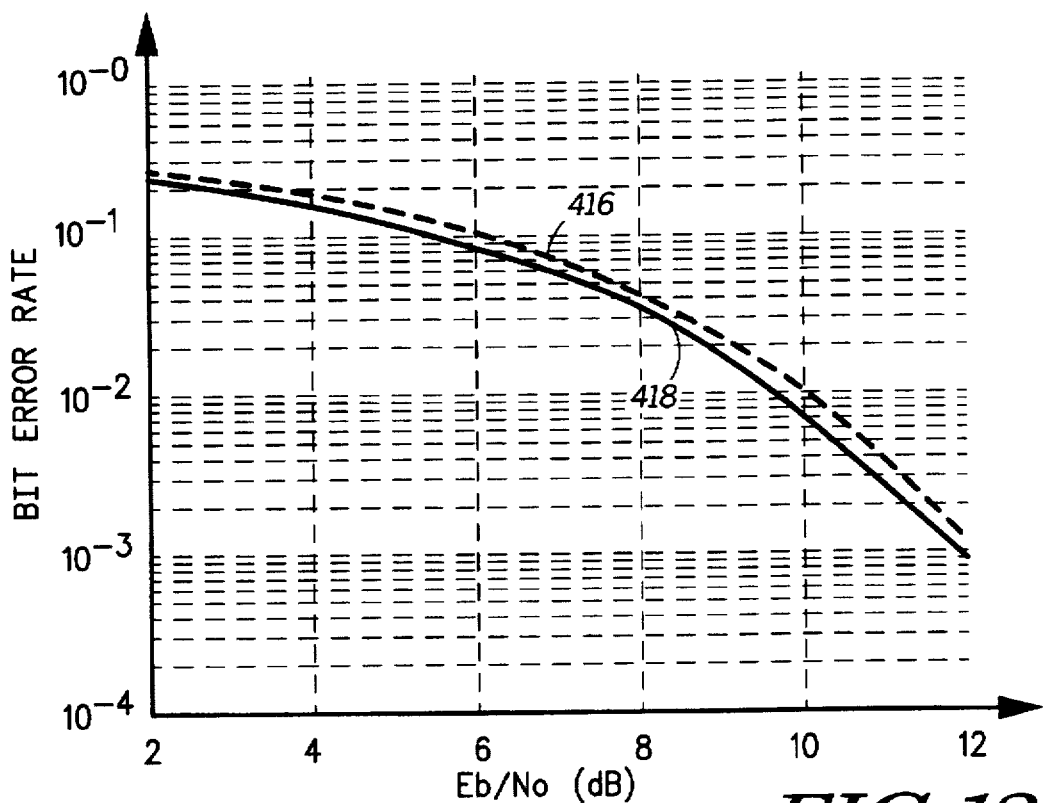
FIGS. 12 through 14 are illustrations of the performance of the receiver according to the present invention.
Figure 13:
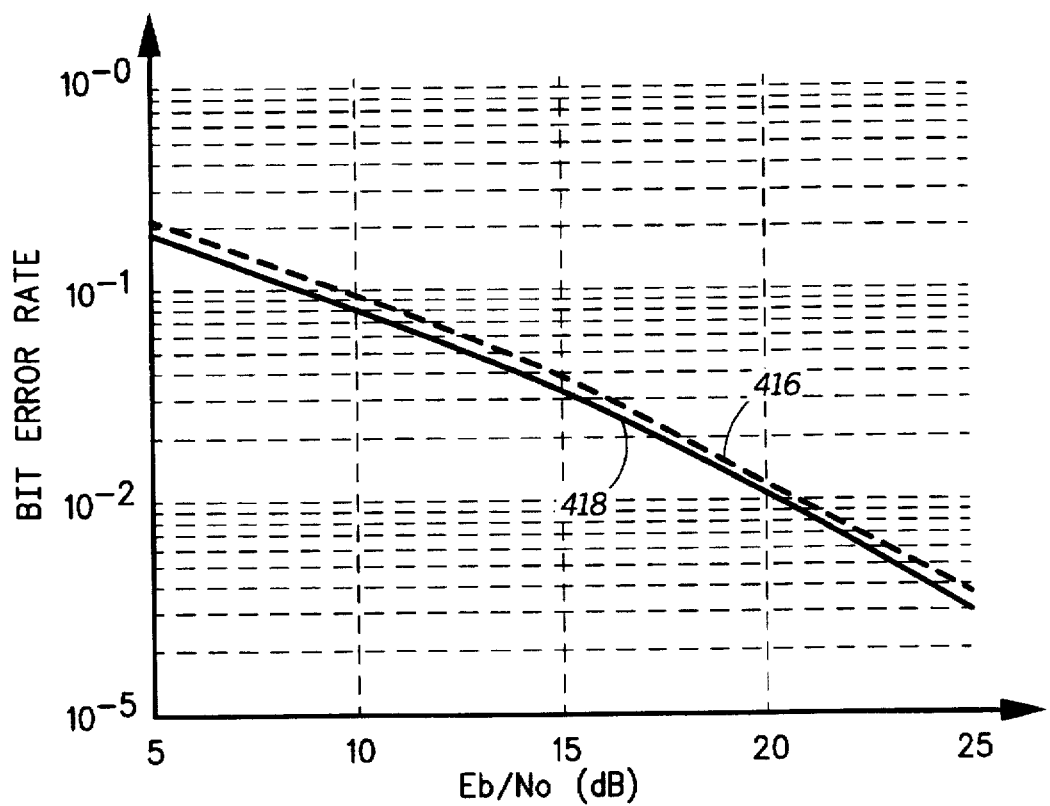
Figure 14:
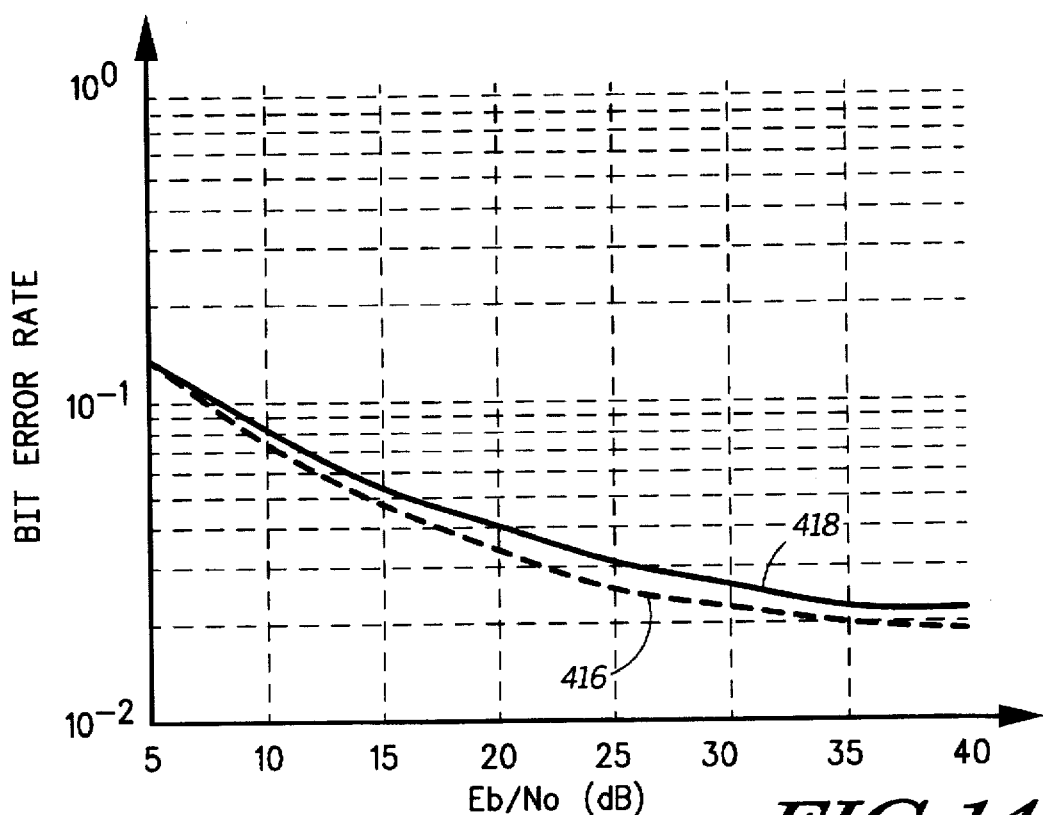

FIGS. 12 through 14 are illustrations of the performance of the receiver 100 according to the present invention. The dashed plots 416 are representative of the performance of a conventional analog FSK receiver, while the solid plots 418 are representative of the performance of the receiver 100 of the present invention. These plots compare the performance between the conventional analog FSK receiver, and the receiver 100. The analog FSK receiver utilized for the present comparison comprises an analog discriminator (i.e., a frequency-to-voltage converter), a post-detection filter, and a multi-level symbol detector. All of these elements are conventional elements well known to those of ordinary skill in the art.

The plots of FIGS. 12 through 14 illustrate simulations of the bit-error-rate performance of the conventional analog FSK receiver and the receiver 100 of the present invention. Each simulation represents three communication environments. FIG. 12 represents a communication environment where static Gaussian noise is present during RF communications. FIG. 13 represents a communication environment that experiences Rayleigh fading (with walk speed v=5 mph). And FIG. 14 represents a simulcast communication system having a relative power=0 dB, simulcast delay=80 us (~¼ symbol) and a frequency offset=30 Hz. As can be seen, the performance of the receiver 100 is substantially similar to that of the analog FSK receiver.

However, the receiver 100 has several advantages over the prior art analog receiver. First, the demodulator circuit 110 of the receiver 100 comprises digital components only, thereby allowing these circuits to be fully integrated into an IC. Also, with the advent of high performance low power IC technology such as CMOS logic, the power consumption of the receiver 100 is substantially superior to prior art analog receivers.

Yet another advantage is that the demodulator circuit 110 is immune to upgrades in IC fabrication technology, e.g., 1 micron technology upgraded to 0.5 micron technology. Since the demodulator circuit 110 utilizes digital logic, redesign of the demodulator circuit 110 after a fabrication upgrade is not necessary. In contrast, because the circuits of the prior art analog receivers are primarily analog, such circuits generally require redesign. Finally, it is well-known in the art that the parametric values of analog circuits experience large variances during manufacturing. As a result, some level of tuning is required in the manufacture of each analog receiver. Because the demodulator circuit 110 has no analog components, tuning is not required.

Figure 15:
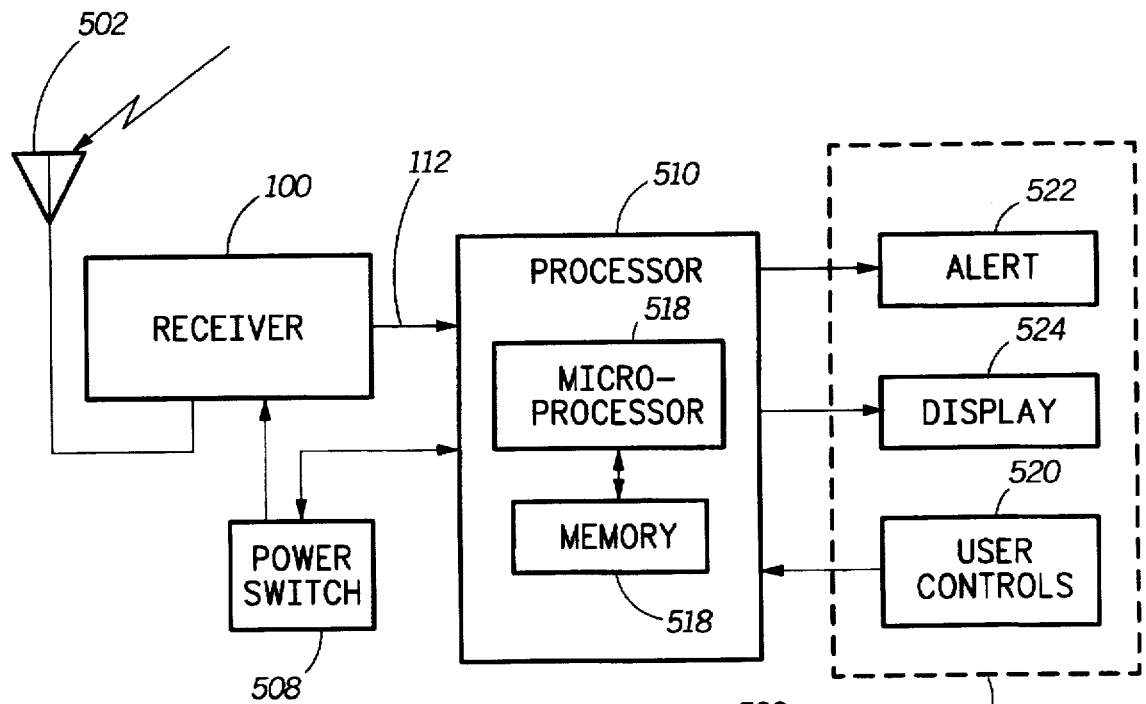
FIG. 15 is an electrical block diagram of a selective call receiver utilizing the receiver according to the present invention.
Figure 10:
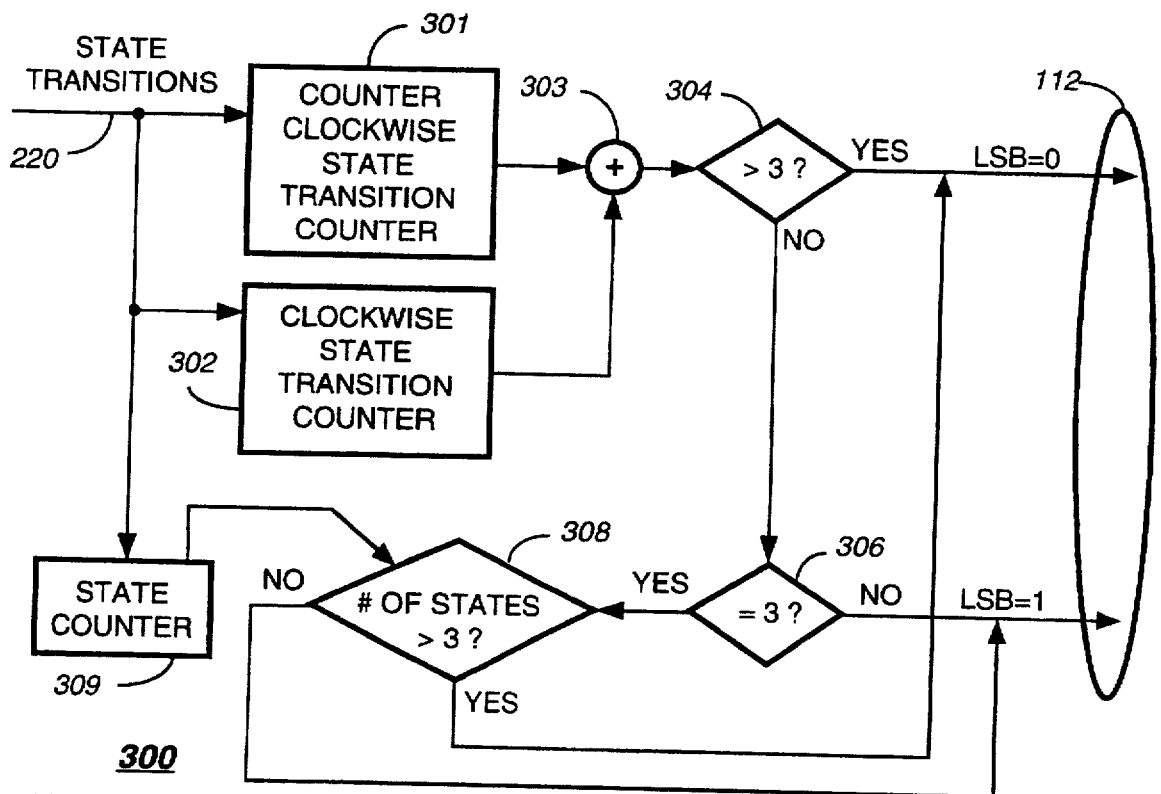
Figure 11:
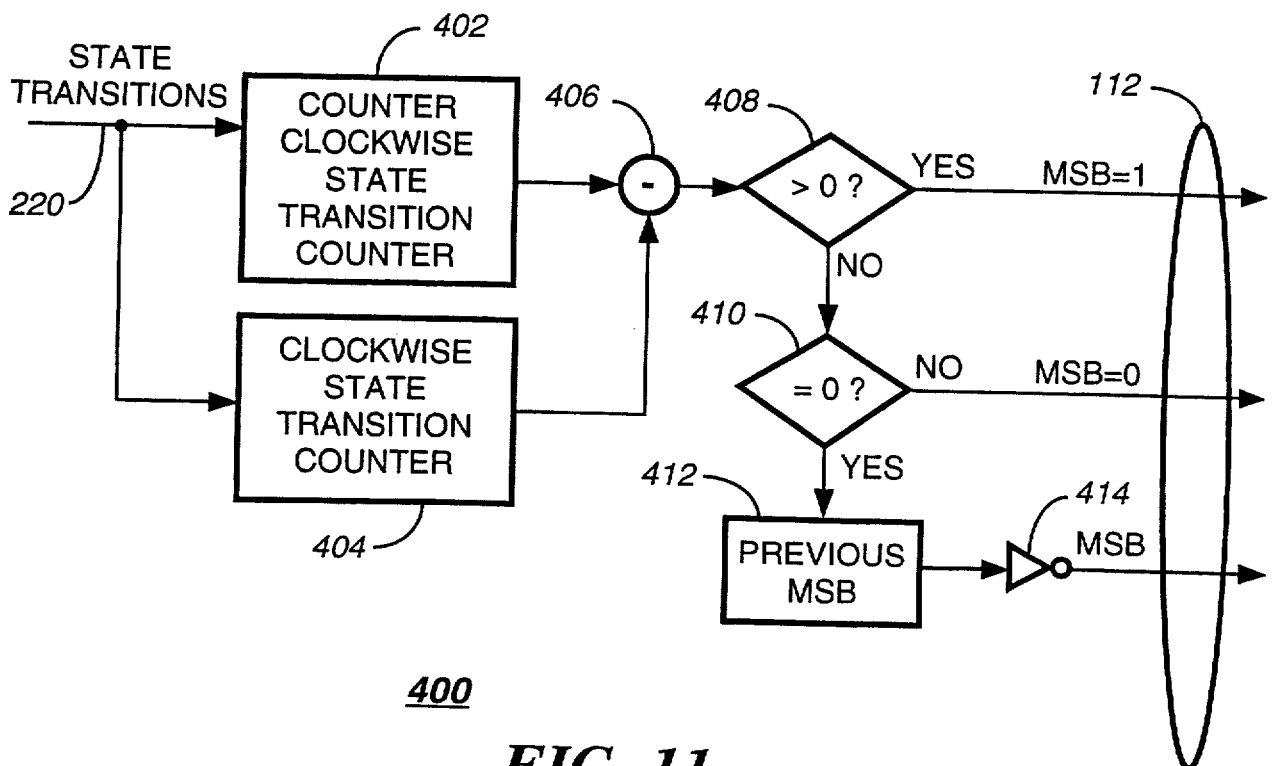

FIG. 15 is an electrical block diagram of a selective call receiver (SCR) 500 utilizing the receiver 100 according to the present invention. The SCR 500 comprises the receiver 100 described above coupled to a conventional antenna 502, a power switch 508, a processor 510, and a user interface 521. The receiver 100 and antenna 502 are utilized for receiving messages transmitted by a radio communication system. The receiver 100 generates digital data which is then processed by the processor 510.

The power switch 508 is a conventional switch, such as a MOS (metal oxide semiconductor) switch for controlling power to the receiver 100 under the direction of the processor 510, thereby providing a battery saving function.

The processor 510 is used for controlling operation of the SCR 500. Generally, its primary function is to decode and process demodulated messages provided by the receiver 100, storing them and alerting a user of the received message. To perform this function, the processor 510 comprises a conventional microprocessor 516 coupled to a conventional memory 518 having nonvolatile and volatile memory portions, such as a ROM (read-only memory) and RAM (random-access memory). One of the uses of the memory 518 is for storing messages received from the radio communication system. Another use is for storing one or more selective call addresses utilized in identifying incoming personal or group messages to be intercepted by the SCR 500.

Once a message has been decoded and stored in the memory 518, the processor 510 activates the alerting device 522 (included in the user interface 521) which generates a tactile and/or audible alert signal to the user. The user interface 521, which further includes, for example, a conventional LCD display 524 and conventional user controls 520, is utilized by the user for processing the received messages. This interface provides options such as reading, deleting, and locking of messages.

To communicate messages to the SCR's 500, the radio communication system preferably utilizes a protocol such as the FLEX protocol, developed by Motorola, Inc. (FLEX is a trademark of Motorola, Inc.) for transmitting synchronous messages. The FLEX protocol is a digital selective call signaling protocol that is presently used by various system operators in the United States and in several other countries. It will be appreciated that, alternatively, other signaling protocols that are suitable to the present invention can be used.

In sum, because of the advantages provided by the receiver 100 over prior art receivers, the SCR 500 has a substantially better battery life performance over prior art SCR's. Moreover, because the receiver 100 can be fully integrated in an IC, and is immune to fabrication variances (i.e., is portable across many fabrication technologies), the quality of manufacturing SCR's is substantially superior to that of prior art SCR's utilizing analog FSK receivers.

What is claimed is:

1. A method for demodulating a multi-level frequency shift keyed (FSK) signal, comprising the steps of:

receiving the multi-level FSK signal from a radio messaging system;

mixing the multi-level FSK signal to generate an in-phase signal and a quadrature signal;

counting a sequence of state transitions of the in-phase signal and the quadrature signal; and determining a frequency deviation of the multi-level FSK signal based on the sequence of state transitions counted.

2. The method as recited in claim 1, wherein frequency deviations have polarities with respect to a frequency reference, and wherein the step of determining the frequency deviation includes determining the polarity of each frequency deviation based on a direction of the sequence of state transitions.

3. The method as recited in claim 1, wherein frequency deviations have magnitudes of deviation with respect to a frequency reference, and wherein the step of determining the frequency deviation includes determining the magnitude of deviation of each frequency deviation based on counting the sequence of state transitions within a predetermined range of transitions.

4. The method as recited in claim 1, wherein frequency deviations have polarities with respect to a frequency reference, and wherein the step of determining a given frequency deviation includes assigning an opposite polarity of a previously determined frequency deviation to the polarity of the given frequency deviation when the sequence of state transitions counted comprises two sequences, each sequence having a substantially equal number of state transitions going in opposite directions.

5. The method as recited in claim 1, further including the step of counting a sequence of states of the in-phase signal and the quadrature signal, wherein frequency deviations have magnitudes of deviation with respect to a frequency reference, and when the sequence of state transitions counted is between a first and second predetermined range of transitions, the step of determining a given frequency deviation includes assigning:

a first magnitude of deviation to the given frequency deviation when the sequence of states counted is above a predetermined threshold; and a second magnitude of deviation to the given frequency deviation when the sequence of states counted is below the predetermined threshold.

6. The method as recited in claim 1, wherein the frequency deviation is representative of a symbol of data, the symbol of data corresponding to at least one bit of data.

7. A method for demodulating a multi-level frequency shift keyed (FSK) signal, comprising the steps of:
receiving the multi-level FSK signal from a radio messaging system;
mixing the multi-level FSK signal to generate an in-phase signal and a quadrature signal;
counting a sequence of state transitions of the in-phase signal and the quadrature signal;
determining a frequency deviation of the multi-level FSK signal based on the sequence of state transitions counted;
wherein frequency deviations have polarities with respect to a frequency reference, and wherein the step of determining the frequency deviation includes determining the polarity of each frequency deviation based on a direction of the sequence of state transitions; and
wherein frequency deviations have magnitudes of deviation with respect to a frequency reference, and wherein the step of determining the frequency deviation further includes determining the magnitude of deviation of each frequency deviation based on counting the sequence of state transitions within a predetermined range of transitions.

8. A method for demodulating a multi-level frequency shift keyed (FSK) signal, comprising the steps of:
receiving the multi-level FSK signal from a radio messaging system;
mixing the multi-level FSK signal to generate an in-phase signal and a quadrature signal;
counting a sequence of states and a sequence of state transitions of the in-phase signal and the quadrature signal; and
determining a frequency deviation of the multi-level FSK signal based on the sequence of state transitions counted;
wherein the step of determining a given frequency deviation includes assigning an opposite polarity of a previously determined frequency deviation to the polarity of the given frequency deviation when the sequence of state transitions counted comprises two sequences, each sequence having a substantially equal number of state transitions going in opposite directions; and
when the sequence of state transitions counted is between a first and second predetermined range of transitions, the step of determining the given frequency deviation includes assigning:
a first magnitude of deviation to the given frequency deviation when the sequence of states counted is above a predetermined threshold; and
a second magnitude of deviation to the given frequency deviation when the sequence of states counted is below the predetermined threshold.

9. A receiver for receiving a multi-level frequency shift keyed (FSK) signal, comprising:
a mixer for mixing the multi-level FSK signal to generate an in-phase signal and a quadrature signal; and
a demodulator circuit coupled to the mixer,
the demodulator circuit adapted to:
count a sequence of state transitions of the in-phase signal and the quadrature signal; and
determine a frequency deviation of the multi-level FSK signal based on the sequence of state transitions counted.

10. The receiver as recited in claim 9, further comprising:
a first and second low-pass filter coupled to the in-phase signal and the quadrature signal, respectively; and
a first and second limiter coupled to an output of the first and second low-pass filter, respectively, each limiter generating a two level voltage signal to the demodulator circuit.

11. The receiver as recited in claim 9, the demodulator circuit comprising an algorithmic state machine programmed to count the sequence of state transitions and determine the frequency deviation therefrom.

12. The receiver as recited in claim 9, wherein frequency deviations have polarities with respect to a frequency reference, and wherein the demodulator circuit's function of determining the frequency deviation includes determining the polarity of each frequency deviation based on a direction of the sequence of state transitions.

13. The receiver as recited in claim 9, wherein frequency deviations have magnitudes of deviation with respect to a frequency reference, and wherein the demodulator circuit's function of determining the frequency deviation includes determining the magnitude of deviation of each frequency deviation based on counting the sequence of state transitions within a predetermined range of transitions.

14. The receiver as recited in claim 9, wherein frequency deviations have polarities with respect to a frequency reference, and wherein the demodulator circuit's function of determining a given frequency deviation includes assigning an opposite polarity of a previously determined frequency deviation to the polarity of the given frequency deviation when the sequence of state transitions counted comprises two sequences, each sequence having a substantially equal number of state transitions going in opposite directions.

15. The receiver as recited in claim 9, wherein the demodulator circuit further includes the function of counting a sequence of states of the in-phase signal and the quadrature signal, wherein frequency deviations have magnitudes of deviation with respect to a frequency reference, and when the sequence of state transitions counted is between a first and second predetermined range of transitions, the demodulator circuit's function of determining a given frequency deviation includes assigning:
a first magnitude of deviation to the given frequency deviation when the sequence of states counted is above a predetermined threshold; and
a second magnitude of deviation to the given frequency deviation when the sequence of states counted is below the predetermined threshold.

16. A selective call receiver comprising the receiver of claim 9.

17. A receiver for demodulating a multi-level frequency shift keyed (FSK) signal, comprising:
a mixer for mixing the multi-level FSK signal to generate an in-phase signal and a quadrature signal;
a first and second low-pass filter coupled to the in-phase signal and the quadrature signal, respectively;
a first and second limiter coupled to an output of the first and second low-pass filter, respectively, each limiter generating a two level voltage signal; and
a demodulator circuit coupled to the first and second limiter, the demodulator circuit comprising an algorithmic state machine,
the algorithmic state machine programmed to:
count a sequence of state transitions of the in-phase signal and the quadrature signal;
determine a frequency deviation of the multi-level FSK signal based on the sequence of state transitions counted;

wherein frequency deviations have polarities with respect to a frequency reference, and wherein the function of determining the frequency deviation includes determining the polarity of each frequency deviation based on a direction of the sequence of state transitions; and wherein frequency deviations have magnitudes of deviation with respect to a frequency reference, and wherein the function of determining the frequency deviation further includes determining the magnitude of deviation of each frequency deviation based on counting the sequence of state transitions within a predetermined range of transitions.

18. A selective call receiver comprising the receiver of claim 17.

19. A receiver for demodulating a multi-level frequency shift keyed (FSK) signal, comprising:

a mixer for mixing the multi-level FSK signal to generate an in-phase signal and a quadrature signal;

a low-pass filter (LPF) coupled to the mixer;

a limiter coupled to the LPF for generating a two level voltage signal; and a demodulator circuit coupled to the limiter, the demodulator circuit adapted to:

count a sequence of states and a sequence of state transitions of the in-phase signal and the quadrature signal; and determine a frequency deviation of the multi-level FSK signal based on the sequence of state transitions counted;

wherein the function of determining a given frequency deviation includes assigning an opposite polarity of a previously determined frequency deviation to the polarity of the given frequency deviation when the sequence of state transitions counted comprises two sequences, each sequence having a substantially equal number of state transitions going in opposite directions; and when the sequence of state transitions counted is between a first and second predetermined range of transitions, the function of determining the given frequency deviation includes assigning:

a first magnitude of deviation to the given frequency deviation when the sequence of states counted is above a predetermined threshold; and a second magnitude of deviation to the given frequency deviation when the sequence of states counted is below the predetermined threshold.

20. A selective call receiver comprising the receiver of claim 19.

* * * * *

UNITED STATES PATENT AND TRADEMARK OFFICE
CERTIFICATE OF CORRECTION

Page 1 of 2

PATENT NO. : 5,724,001
DATED : Mar. 3, 1998
INVENTOR(S) : Chang

It is certified that error appears in the above-identified patent and that said Letters Patent is hereby corrected as shown below:

Please delete drawing sheet 5 and substitute drawing sheet 5 as per attached.

Signed and Sealed this

Twenty-fifth Day of May, 1999

Attest:

Q. TODD DICKINSON

*Attesting Officer*   Acting Commissioner of Patents and Trademarks